United States Patent [19]

Bocchicchio et al.

[11] Patent Number: 4,767,298
[45] Date of Patent: Aug. 30, 1988

[54] HEAT STAKING APPARATUS

[75] Inventors: Keith A. Bocchicchio, Middletown; David L. Hall, Hummelstown; Mark F. Jackson; Joseph R. Keller, both of Harrisburg; Karl H. Letsch, Wyomissing, all of Pa.

[73] Assignee: AMP Incorporated, Harrisburg, Pa.

[21] Appl. No.: 945,434

[22] Filed: Dec. 22, 1986

[51] Int. Cl.[4] .............................................. B29C 65/02
[52] U.S. Cl. .................................. 425/112; 29/243.5; 264/249; 264/548; 264/DIG. 65; 425/518
[58] Field of Search .............. 425/110, 112, 517, 518; 264/249, 500, 521, 548, 564, DIG. 46, DIG. 50, DIG. 65, DIG. 66; 29/243, 243.5, 509

[56] References Cited

U.S. PATENT DOCUMENTS

| | | | |
|---|---|---|---|
| 3,367,809 | 2/1968 | Soloff | 156/673.1 |
| 3,458,618 | 7/1969 | Burns et al. | 264/249 |
| 3,499,808 | 3/1970 | Obeda | 264/249 |
| 4,253,226 | 3/1981 | Takeda | 264/249 |
| 4,455,134 | 6/1984 | Biggs | 425/517 |
| 4,633,559 | 1/1987 | Loren | 264/249 |

Primary Examiner—Jay H. Woo
Assistant Examiner—C. Scott Bushey
Attorney, Agent, or Firm—Thomas G. Terrell; William B. Noll

[57] ABSTRACT

An apparatus for heat staking plastic parts to other parts to form an assembly are featured, using multiple heating elements which are arranged in zones and which are separately programmable in terms of temperature and displacement to develop optimum deformation of plastic having different characteristics. The heating elements are isolated thermally to provide an improved conservation of heat energy.

7 Claims, 9 Drawing Sheets

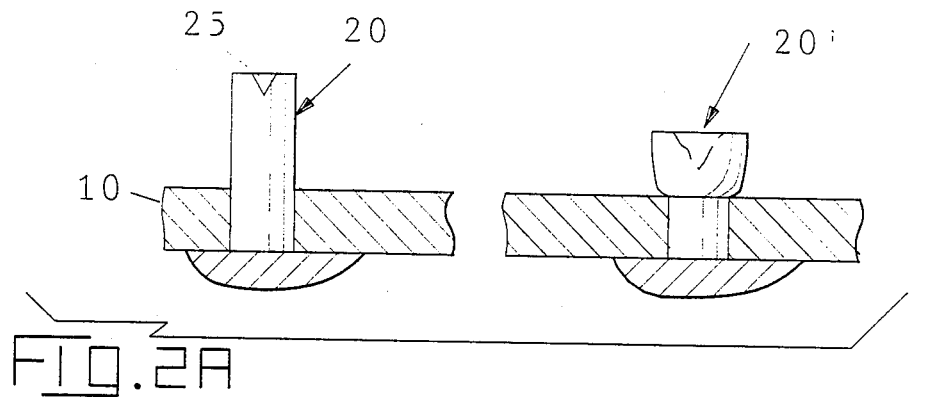
FIG.2A
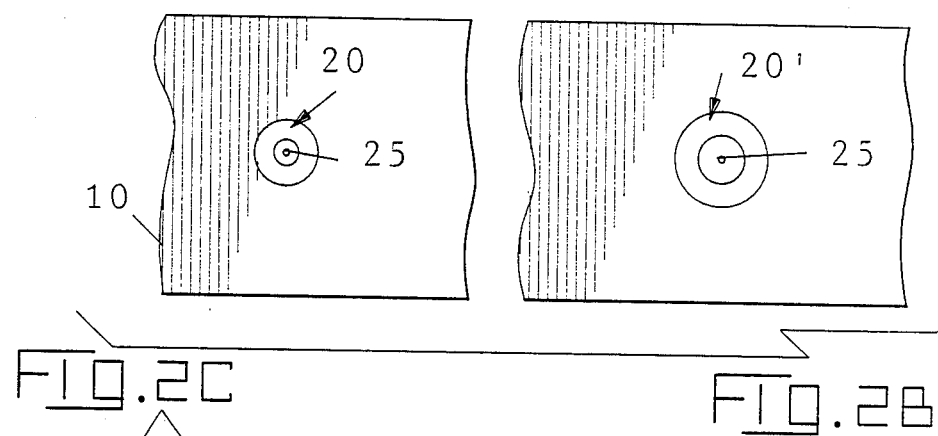
FIG.2C  FIG.2B
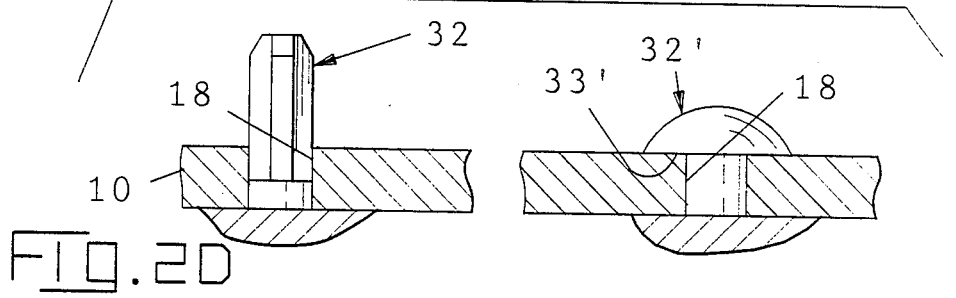
FIG.2D
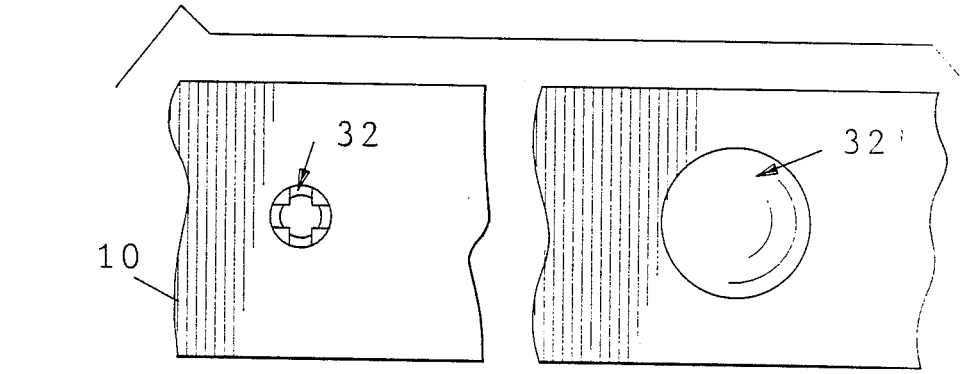

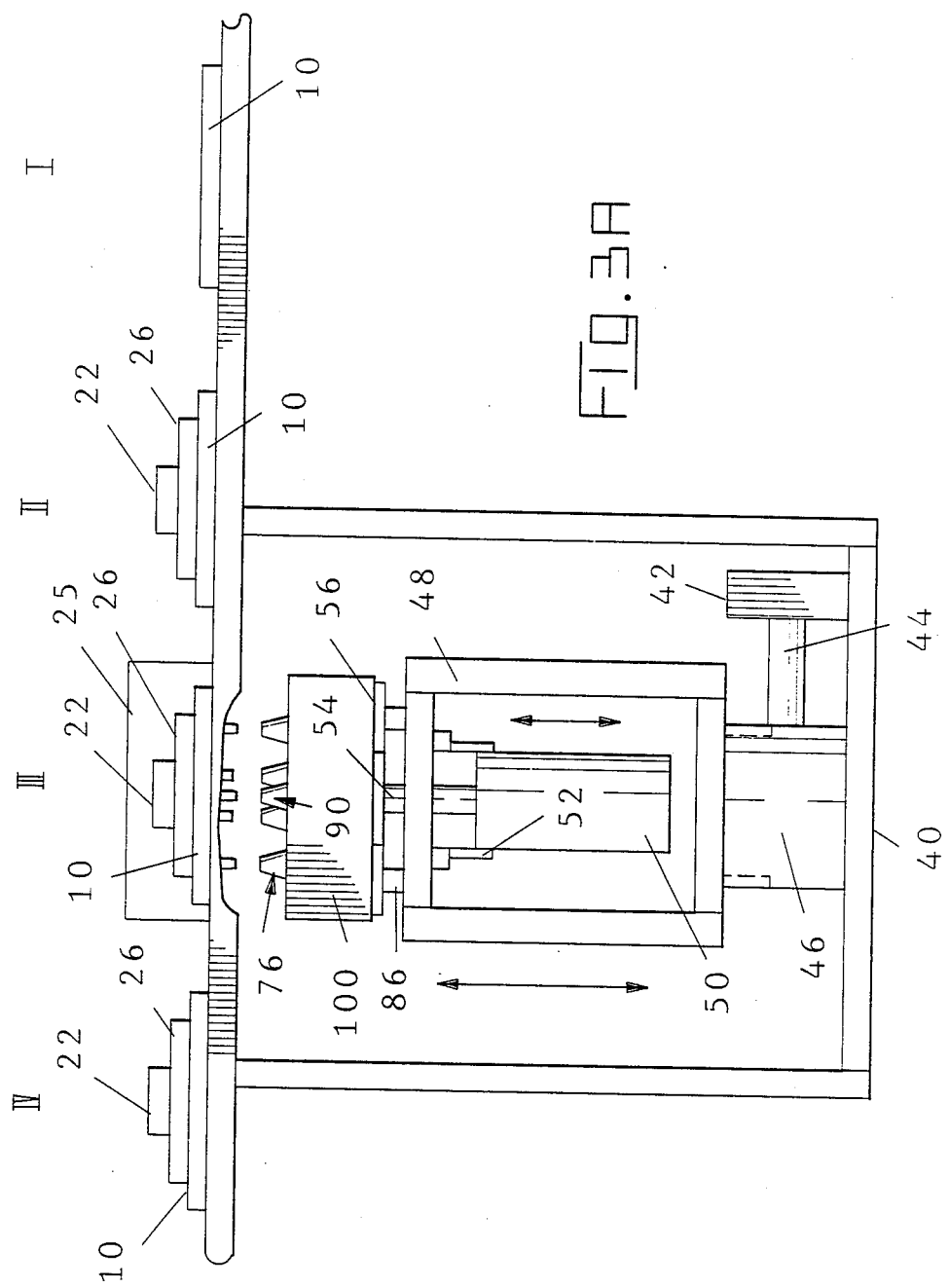

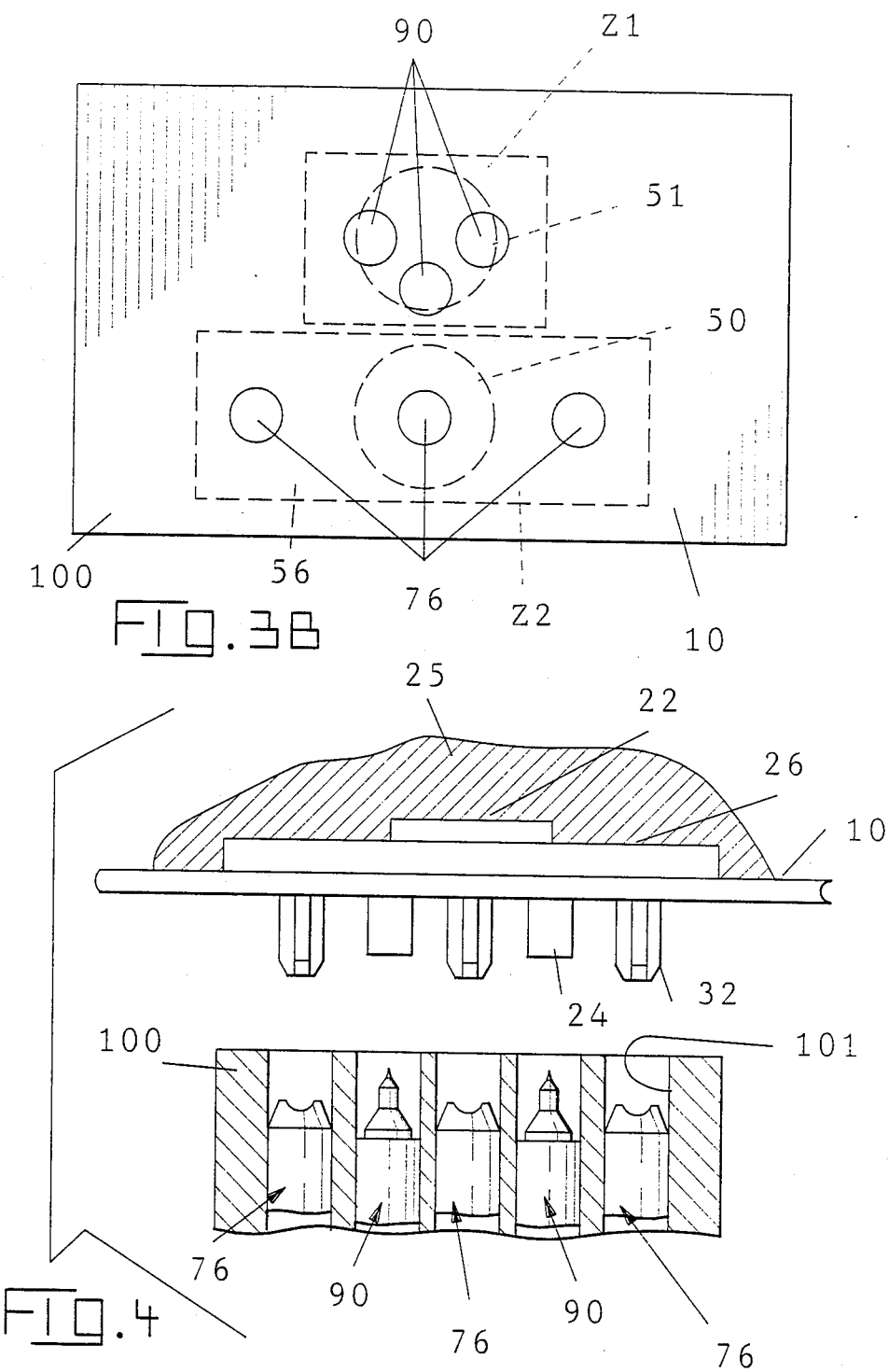

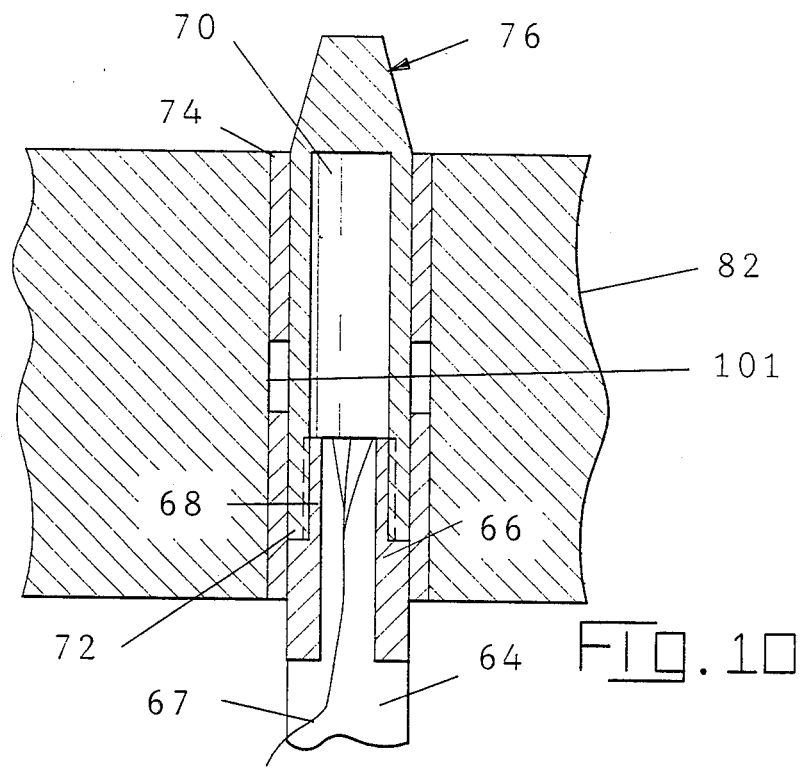

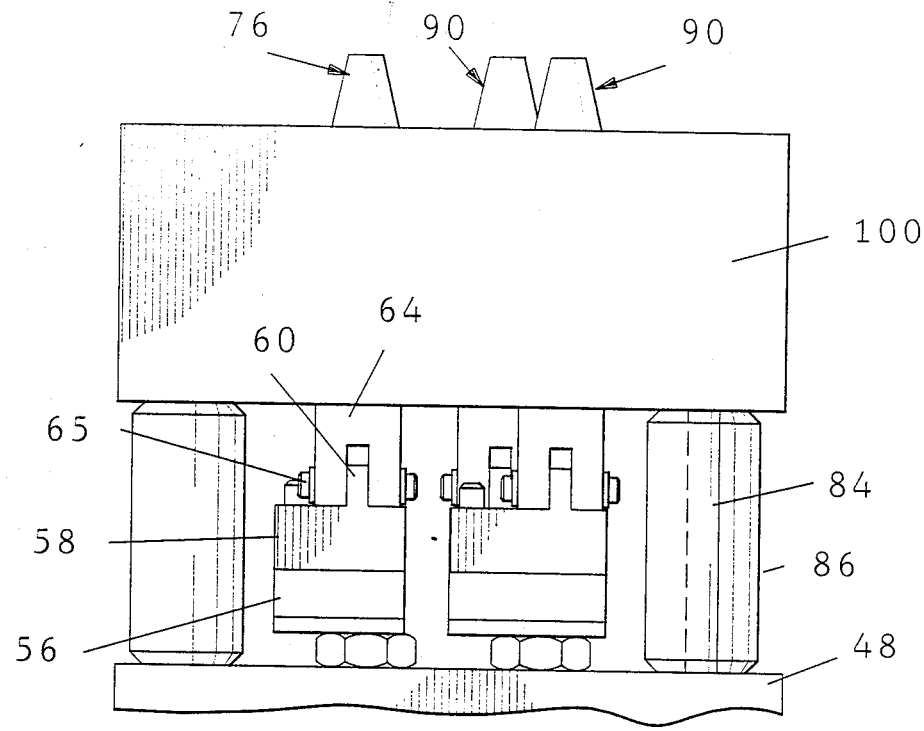
FIG. 11
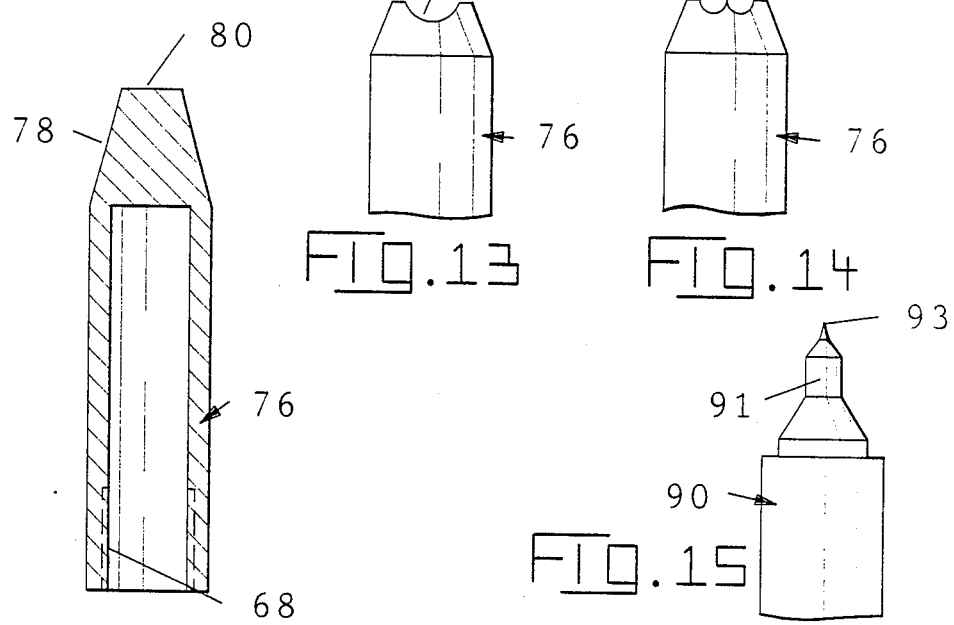
FIG. 12  FIG. 13  FIG. 14
FIG. 15

HEAT STAKING APPARATUS

The present invention relates to an improved method for heat staking parts together in conjunction with apparatus for effecting such method.

BACKGROUND OF THE INVENTION

Heat staking as a means of locking parts together is well known and has been used for years in a variety of applications including the assembly of parts for the toy industry, the medical industry, and the electronic industry. In general, one of the parts to be assembled is designed to include a plastic post or tab which can be inserted through a hole or aperture in another part and then permanently and inelastically deformed by the generation or application of heat by some tool surface which effects plastic deformation. The variables which must be dealt with include the characteristics of the particular plastic material employed including its flow and melt temperatures, the nature and characteristics of the tooling employed and the geometries thereof, means by which the tooling may be brought to bear against the plastic elements to be deformed, the choice of method for effecting heating, and the parameters of pressure, time, and heat energy applied.

With respect to the assembly of components such as electrical connectors or housings and particularly with respect to mounting such components on printed circuit boards, the concept of heat staking has become more important with the advent of what is known as "surface mounting technology" or SMT as a means of effecting solder or solder-like joints between the contacts of such components and the circuit traces of the printed circuit boards. The surface bonds of contacts and circuit traces by solder is more demanding of the housing structure in relation to strains and stresses which is minimized by securing the housings to the boards independently of such bonds. To this end, one solution has been to secure the housings to a board by screws, pop rivets, or the like. The problem with such techniques is essentially one of economics wherein the ears or wings or brackets added to housings take up board space which is frequently quite expensive, require extra parts in the form of such rivets or the like, and require the labor of assembly which is not easily automated.

As a further aspect of the background of the invention, there is an increasing density of electrical interconnection being employed in the electronic industry which makes it very difficult to provide space within the outline of a given connector for adding mounting means such as rivets or the like.

As a further part of the background of the invention, many assemblies including assemblies of electronic components to printed circuit boards or similar structures, contain components of housings of different plastic materials having different flow and melt characteristics, creating a problem which has heretofore been generally answered by having multiple sets of tooling and different times of cycle which are costly in both capital and labor.

Finally, in the general field of heat staking, problems have been encountered with the buildup of heat which if not dealt with by special cooling techniques, can damage the components which are being heat staked, create unacceptable environments for operator or machine, and, in general, utilize many, many times the energy really necessary to effect heat staking, thereby creating an unpleasant inefficiency.

SUMMARY OF THE INVENTION

The present invention is directed to and has as its object a method of heat staking and to an apparatus therefor which allows components having different material characteristics and different geometries to be heat staked simultaneously at the same work station and in approximately the same work cycle. This is accomplished by arranging individual heat staking tools which can be separately controlled in terms of heat and displacement. The tips may be given different shapes and geometries and selectively and programmably driven to exert not only different pressures during the staking operation, but pressures that may be varied within a given cycle of displacement. The apparatus of the invention is so arranged through a combination of hydraulic and ball screw force generating means as to permit relatively close heat staking tip centers through a relatively simple structural arrangement. The invention, apparatus and method further embrace the use of heat staking tips which rest within a thermally insulating block to minimize heat and energy lost by convection or radiation and further, are interconnected to a driving mechanism through a novel insulating linkage to minimize energy loss via conduction. The use of two displacement and force generating means including one having hydraulic characteristics permits control and programmability which yields novel results and reduces cycle time relative to prior art practices. The insulation block in conjunction with controlled displacement achieves an improved efficiency and environmental control.

BRIEF DESCRIPTION OF THE DRAWINGS

FIG. 2A is an enlarged and partially sectioned view of component posts prior to and after heat staking.

FIG. 2B is a top plan view of FIG. 2A.

FIG. 2C is a partially sectioned view, much enlarged, of component posts of a second variety prior to and following heat staking.

FIG. 2D is a top plan view of FIG. 2C.

FIG. 3A is a side elevational view of the apparatus of the invention relative to the force driving elements and directions of action.

FIG. 3B is a partial plan view of the apparatus of FIG. 3A, revealing the modularity aspect thereof providing different zones of operation.

FIGS. 4–8 are part side elevational views of components mounted on a board before, during and following heat staking by the apparatus of the invention, showing in particular the displacement of heating tips to effect plastic component post deformation.

FIG. 10 is a partially sectioned view showing the structure of that portion of the apparatus of the invention including the heat tips, its insulating block, the hydraulic drive cylinder and ball screw mechanism.

FIG. 11 is a side elevational view of the apparatus shown in FIG. 10.

FIG. 12 is an enlarged and sectional detail of a heat staking tip and the drive linkage connected thereto.

FIGS. 13–15 are part side elevational and enlarged views of the ends of the heating tips employed by the invention.

DESCRIPTION OF THE INVENTION

Figure 1A:
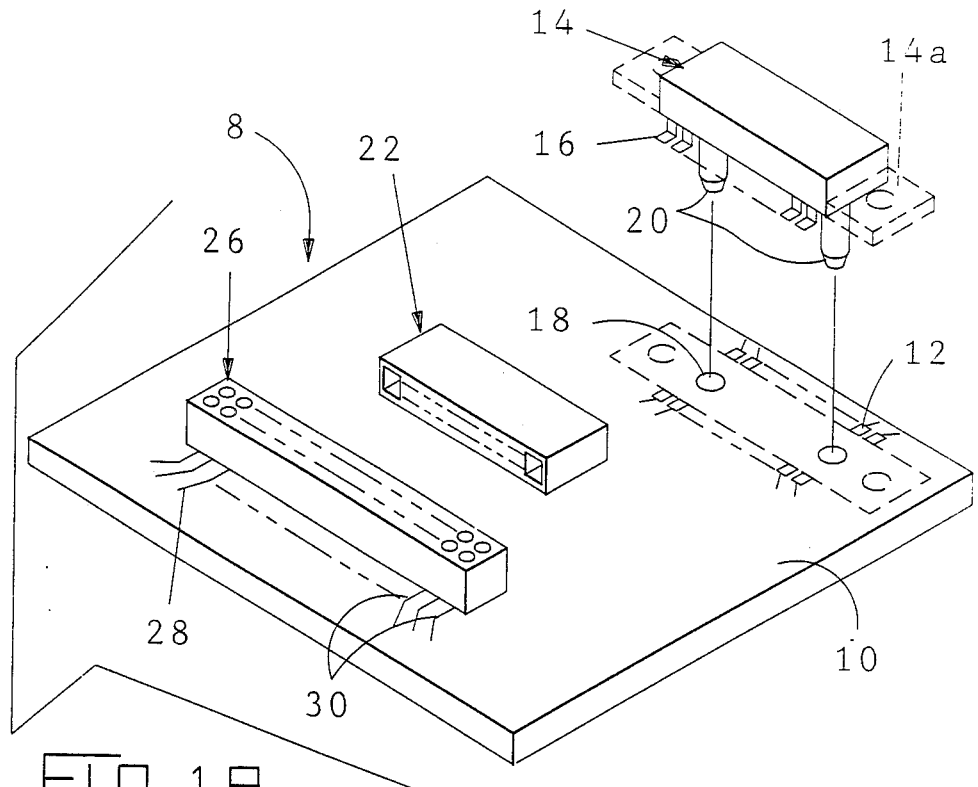
FIG. 1A is a perspective view of electronic components mounted on a printed circuit board.
Figure 1B:
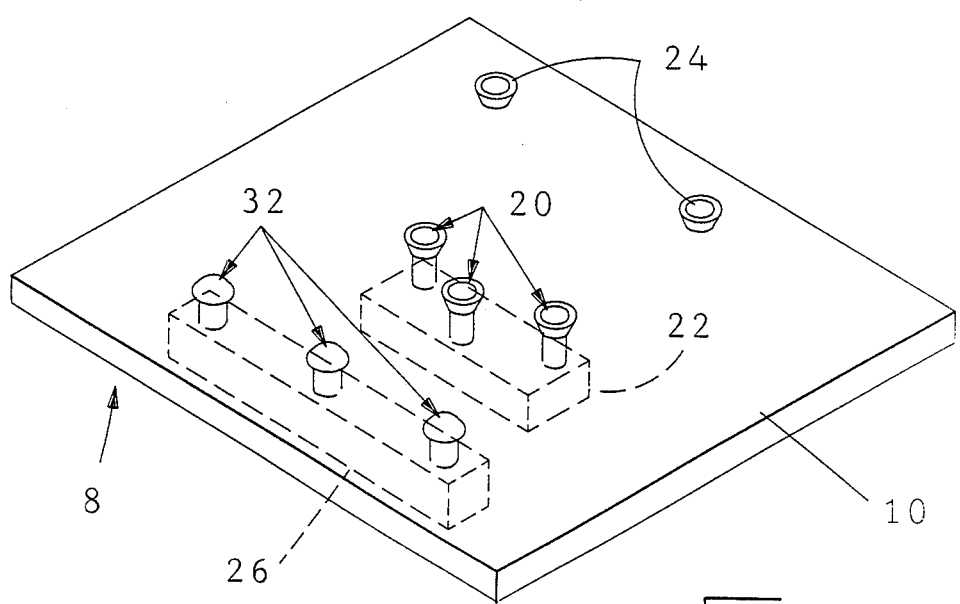
FIG. 1B is a perspective view of the board of FIG. 1A turned upside down to show the details of heat staked posts of such components as shown in FIG. 1A.

Referring now to FIGS. 1A and 1B, an electronic package 8 is shown to include a printed circuit board 10 having a series of components mounted thereon and heat staked thereto. Additionally, in FIG. 1A there is shown a component poised over the surface of board 10 preparatory to mounting. The board 10 may be taken to represent a printed circuit board such as a daughter board or daughter module which carries functioning logic or memory integrated circuit chips or other electronic components. In certain instances, though not here shown, connectors are included allowing such module to be plugged in and removed from other portions of a functioning circuit as, for example, in relation to a mother board. On the upper surface of board 10 are conductive pads 12 arranged in two rows which, in accordance with SMT, would be interconnected to tabs 16 of the component 14. The component 14 includes as an integral part of the plastic housing, posts 20 which are inserted into apertures or holes 18 in board 10. Interconnection of pads 12 which are part of the circuit board 10 to tabs 16 which are part of the circuit of component 14 may be done in a variety of ways, or by by soldering, utilizing a variety of processes available as part of SMT, or by solder reflow effected by infrared or vapor phase techniques. This compares with prior art approaches wherein conductor posts or tabs are inserted into holes in a board such as board 10 and solder reflowed or wave soldered to the circuits thereon.

In FIG. 1A, holes 18 function in engagement with plastic posts 20 to fixture the component and orient the conductive tabs 16 relative to conductive pads 12 during assembly of component 14 to board 10 and during processing to effect solder reflow. As will be appreciated, precise placement of the component 14, its tabs 16, relative to the pads 12 of board 10, is more critical than with prior art approaches wherein the tabs of the component were inserted into holes in the board. That criticality attaches to alignment and assembly and it attaches to a need to minimize stresses and strains on the solder joints between pads 12 and tabs 16 via means to structurally attach the components to the board.

As heretofore mentioned in the background portion of this disclosure, prior art approaches have also included the provision of ears or brackets 14a which are shown in phantom with respect to component 14, having apertures therein through which rivets or nuts and bolts are applied to secure the component to the board. The shadow of a component with such brackets is also shown in phantom on the surface of board 10, along with the additional apertures which would be necessary for such brackets. As can be seen, the brackets take up significant portions of the board surface which is quite important, particularly when the board is a multilayer board. The apertures in the board necessitated the routing of circuit traces more difficult and in general, add to size, weight, and cost of the electronic package employing such techniques.

FIG. 1A also shows two other components 22 and 26 mounted on the upper surface of board 10. These components would have their contact tabs arranged in patterns or rows much like tabs 16 on component 14. The ends or tips of such tabs 28 extend from the housing of component 26 to contact pads 30 on the surface of the board.

FIG. 1B represents the board 10 and the arrangement of FIG. 1A turned upside down showing the underside of the board. As can be discerned, component 22 includes posts 20 which have been inserted through the board and deformed securing the housing of 22 thereto. Also shown in FIG. 1B are posts 32 associated with the component 26 and also deformed securing component 26 to the board.

FIGS. 2A and 2B depict a post construction relative to component 22, the post 20 being shown prior to deformation as 20' following deformation. The post 20 is more or less annular and is made to include in the center thereof an optional indentation 25 which assists engagement by a heat tip and assists in heat transfer from the heat tip to the material of the post. With respect to FIGS. 2A and 2B, the heat staking process which is defined by the geometry of the heat staking tool, in essence enlarges the end of post 20 thereby securing the component to the board. It does this by spreading the end of the post as an enlargement of the indentation 25 much as a plastic rivet does when enlarged.

FIGS. 2C and 2D show an alternative form of post 32 for component 26 prior to and following deformation to effect heat staking. As can be discerned, the post 32 has a cross shaped cross section prior to deformation, the removal of material leaves a volume within the board hole 18 to allow for flow of plastic material during heat staking. As can also be seen from the formed shape of the plastic material of post 32, the material substantially fills the hole 18. This shape is evidenced by post 32' after the heat staking operation. Also revealed in FIGS. 2C and 2D with respect to the type of post and deformation effected by heat staking is the fact that post 32' is deformed to have a head with surfaces 33' engaging the bottom of the board surrounding the hole 18 which secures the component tightly to the board. In accordance with the invention, by essentially filling the hole 18 with reflowed plastic material of the post, the component is secured in both a planar and axial sense. By suitably making the width of the post 32 undersized, very slight dimensional mismatches with respect to hole diameter and/or to center-to-center positioning can be readily accommodated during initial insertion but with a precisely and permanently fixed mounting resulting after reflow.

In brief summary, components are employed which have posts formed of the plastic material of the housings of the components which are inserted into holes in printed circuit boards or the like and then heat staked and formed to secure the components to the boards. As is evidenced by FIGS. 2A through 2D, different post shapes and different heat staking tool geometries may be employed, depending upon the particular type of plastic material of the housing from which the components are made or the heat staking cycle times available or necessary, or the other parameters involved in the overall process.

Also to be understood is that the use of posts integrally formed with component housings is less costly than the addition of brackets, holes, rivets, and the like. The posts are formed simultaneously with the molding of the housing and the incremental additional costs in terms of molding labor are literally nothing, and, in terms of capital for the mold, are very slight.

The choice of post geometry may be widely varied relative to the geometry of the board hole and the invention contemplates a wide variety of different geometries related to the characteristics of the plastic material being heat staked. Thus contemplated, posts may be rectangular, triangular, square, round, tubular and solid or any number of other shapes in accordance with the need of the particular application.

Referring now to FIG. 3A, a production sequence is depicted relative to a series of stations labeled I-IV for board load, component load, clamp and stake, and assembly unload, respectively. These stations may be considered as manual or automated work stations which accommodate the loading of boards 10, followed by the loading of components 22 and 26 onto board 10 and, immediately thereafter, a station which clamps the components to the board in a relatively fixed vertical position for heat staking. The flow of components is shown in FIG. 3A from right to left as upon a track or other kind of conveyor included for illustration.

Continuing now in reference to FIG. 3A, the invention apparatus includes a first frame 40, typically of sheet steel stock assembled to tolerances associated with such application tooling with such stock and the method of joining being chosen to provide a rigid and nonflexing assembly. Frame 40 is fixed against movement. Provided within frame 40 is a stepping motor 42 adapted to drive a shaft 44 connected to a ball screw drive 46. Resting on and attached to drive 46 is a second frame 48 of sheet steel stock which is movable and carries therewithin a set of hydraulic cylinders 50, 51 affixed to the frame 48 by a bracket 52. The cylinders are positioned in the view shown in FIG. 3A, one behind the other, and can best be seen in FIG. 3B as cylinders 50 and 51, only cylinder 50 appears in FIG. 3A. Each cylinder 50, 51 includes a shaft 54 which is actuated in the vertical sense by the cylinders to vertically displace a heat staking base plate 56 to which is attached heat staking elements to be described in greater detail relative to FIGS. 4-8 hereinafter.

FIG. 3B shows in plan the arrangement of heat staking elements relative to components 22 and 26 heretofore mentioned, and relative to the hydraulic cylinders 50 and 51. The invention, method and apparatus, embraces as an important feature the concept of providing multiple zones illustrated by the two zones shown as Z1 and Z2. These zones accommodate the different connectors 22 and 26. In accordance with the invention, these zones are individually controlled in terms of displacement by the hydraulic means included in the apparatus and jointly by the ball screw means included in the apparatus. This control will be described hereinafter relative to FIGS. 9A and 9B.

The heating elements 76, 90 of the apparatus of the invention include heat tips shown in FIGS. 12-15 in some detail. There are six of these heat tips, three for zone Z1 and three for zone Z2, as can best be seen in FIG. 3B. These elements normally rest within an insulating block 100 within apertures 101 therein as is shown in FIG. 4. Block 100 is affixed to frame 48 by bolts 84 at the four corners thereof which are threaded into and secured to the frame 48 (See FIG. 11). These bolts are made to include insulating elements 86 surrounding the exposed surfaces thereof between the block 100 and the frame 48. The heating elements 76 and 90 are separately tied to movable base plates. The base plate for heating elements 76 is shown as elements 56 in FIG. 3A and a similar plate is shown in FIG. 11 with respect to heating elements 76, 90. The base plate 56 is tied to the shaft 54 of the hydraulic cylinder 50 and is cycled vertically by actuation of such cylinder. The heating elements normally rest within insulating block 100 in apertures 101 shown in FIG. 4. This feature serves to considerably reduce the amount of heat which is dissipated by the heating elements through convection. The linkages between base plate 56 and the heating elements include a projection 58 secured to a clevis element 64 in FIG. 11, and are made to be of an insulating material to minimize heat transfer by conduction from the heating elements to the additional metallic parts of the apparatus. It is to be noted that the bolts 84 bear only against the material of block 100 and in their exposed portion, are insulated also.

During a given apparatus and method cycle, the heating tips are extended and retracted from block 100 by actuation of the hydraulic cylinders 50 and 51. This action and the action of the heat staking method is best revealed in FIGS. 4-9. In FIG. 4, the ensemble to be worked upon, namely board 10 with the components 22 and 26 mounted therein and the respective post structures 20 and 32 shown projecting beneath the board, are all shown in an initial position relative to insulating block 100 and the heat staking 76 and 90 resting therewithin. FIG. 4 represents the relative position of the apparatus in components prior to the initiation of the given heat staking cycle and just following movement of the components to the clamp and stake station III as shown in FIG. 3A. In this position, the clamping mechanism, not detailed but shown as 25 is displaced downwardly to capture elements 22, 26 on the board 10, and fix them firmly against upward or sideways movement. Heat elements 76 and 90 are nested in the block 100 and referring now to FIG. 9A, the position of the elements shown in FIG. 4 is at zero relative to both time T and displacement D, which represent the axis and ordinate, respectively, of the curve there revealed.

Figure 9A:
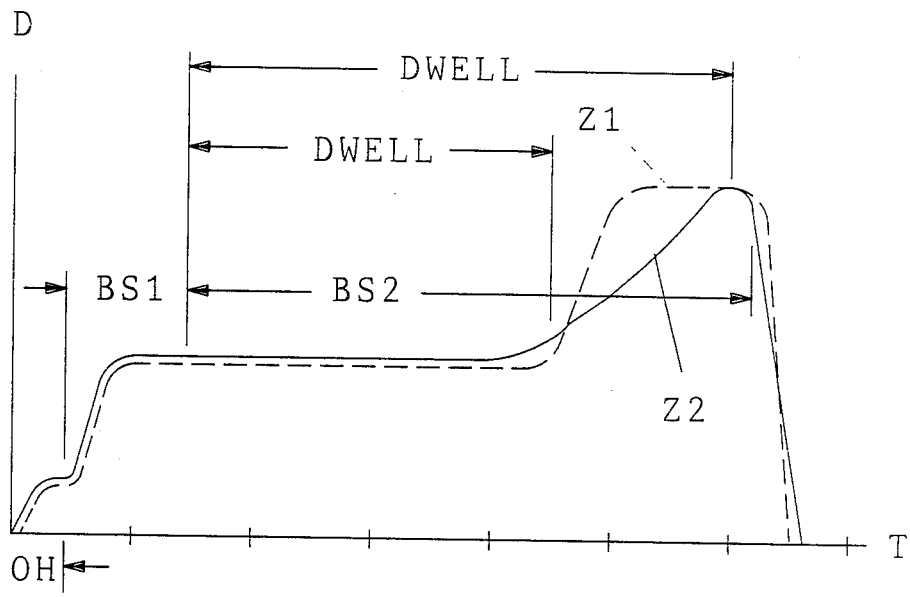
FIG. 9A is an illustrative view of the displacement of the heat staking tips versus time during one exemplary cycle of operation of the apparatus of the invention and FIG. 9B is timing diagram for controlling such movement.
Figure 9B:
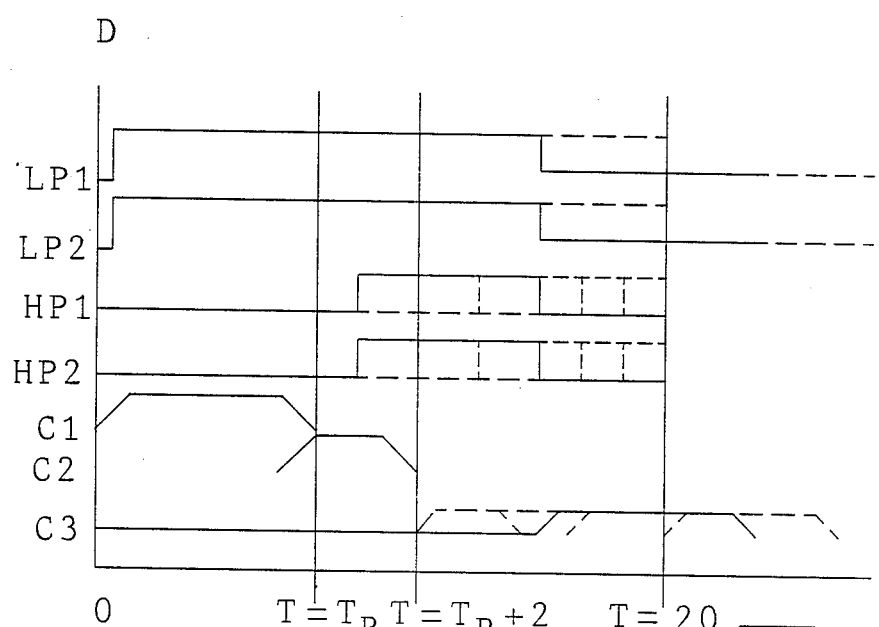

The first phase of the cycle for heat staking is shown in FIG. 9a as H and in that phase, the heat staking elements 76, 90 are caused to emerge from block 100 by actuation of the hydraulic cylinders 50 and 51. This first phase ties in with FIG. 5 which shows the tips of heating elements 76, 90 extended from block 100. In this regard, FIG. 9B shows the control of the various hydraulic cylinders 50, 51 and the ball screw drive 46 which is possible in accordance with the control features of the invention. The upper two displacement time curves LP1 and LP2 shown in FIG. 9B for control zones Z1 and Z2 shown in FIG. 9A represent a low pressure drive movement of the hydraulic cylinders which, as is indicated, can be controlled from a time equal zero up to a time equals a period in excess of 20 seconds if that is desired. In accordance with the invention, tip extension of heating elements 76, 90 is effected by the application of low pressure to the hydraulic cylinders. This in turn causes a low pressure extension of the tips of heating elements 76, 90. Almost simultaneously, the second phase of the heat staking cycle is accomplished by actuation of the stepping motor 42 and thus the ball drive 46 movement is shown in FIG. 9A as BS1. In accordance with a preferred practice, the heat staking tips are physically disposed relative to the nominal projecting length of the posts 20 and 32 so as to be driven thereagainst and to touch simultaneously, all tips with all posts during the phase BS1 as shown in FIG. 6.

Figure 5:
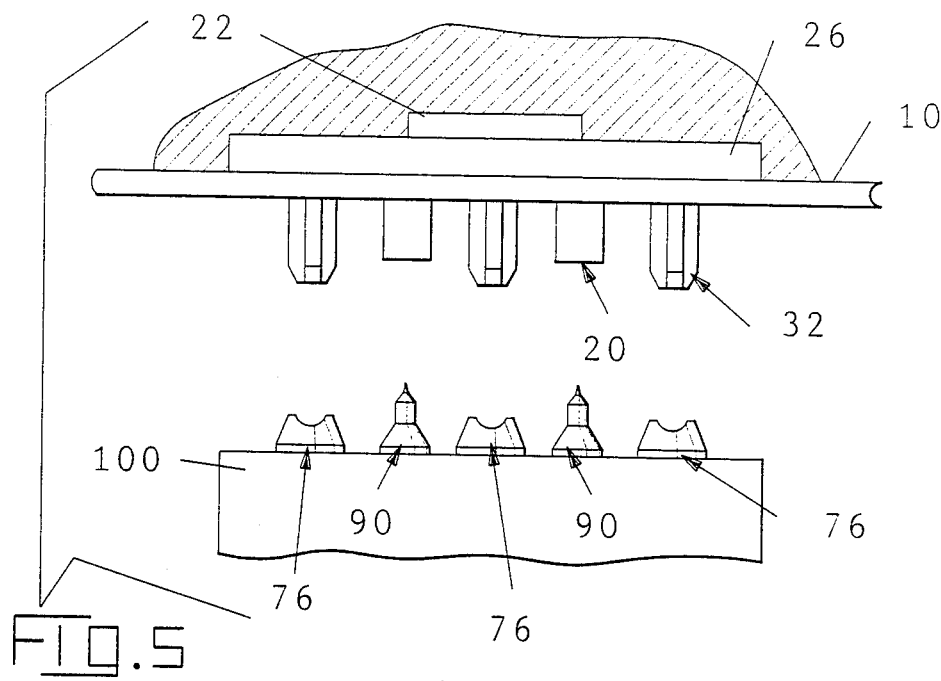
Figure 6:
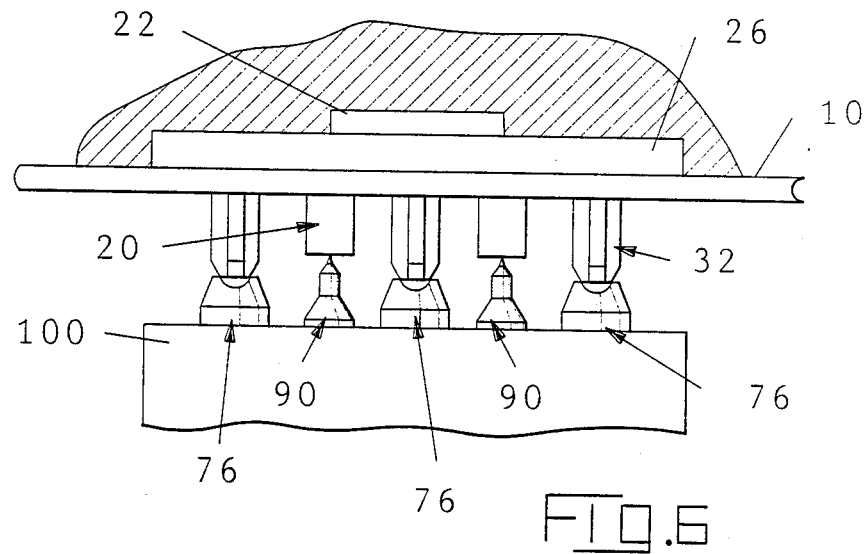

As can be seen in FIGS. 4 and 5, the posts 20 and 32 have different lengths and the tips are physically dimensioned and adjusted to have different vertical positions to accomplish this feature. The precise movement of frame 48 and thus the tips during phase BS1 is controlled by an appropriate application of pulses to the stepping motor 42. Control of motor 48 can be regulated as shown by C1 in FIG. 9B.

Figure 7:
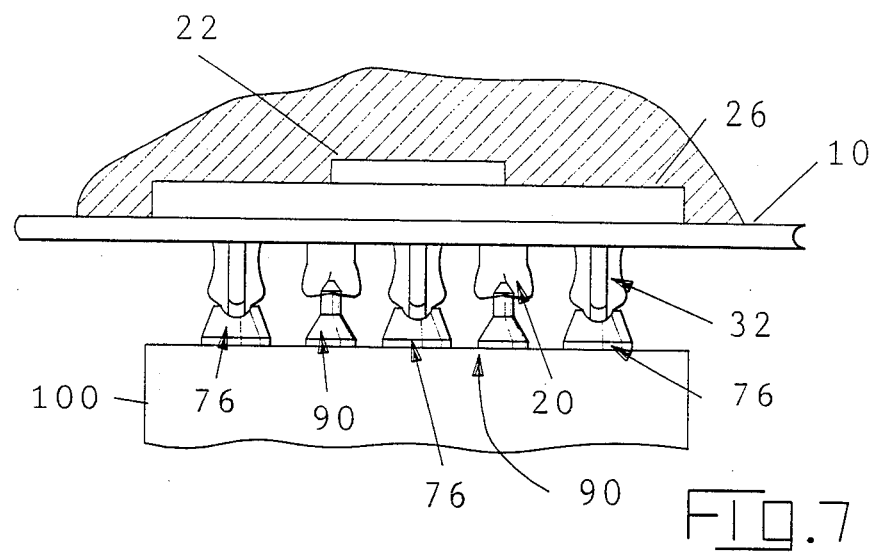
Figure 8:
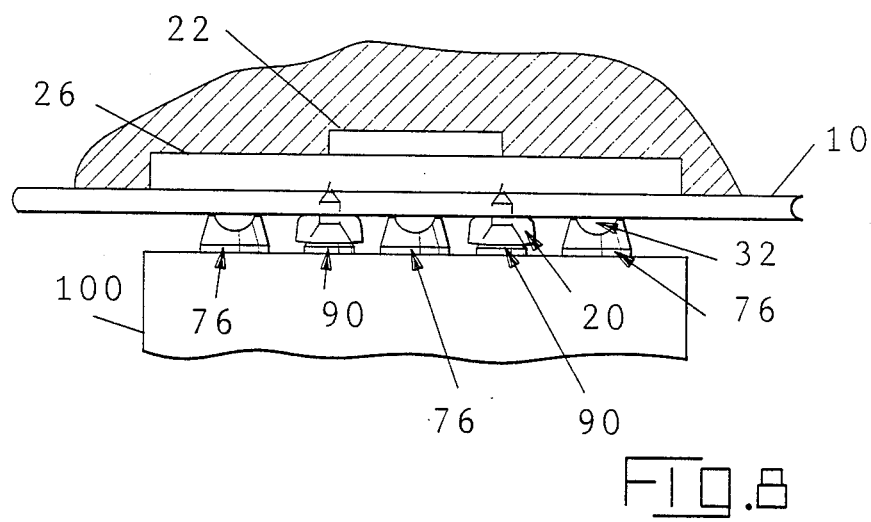

In accordance with the method of the invention, by using the low pressure drive of the hydraulic cylinders 50, 51 at this phase of the heat staking cycle, slight dimensional variations in either the position of the heat staking tips or the position of ends of the posts, will not result in the posts being crushed or unduly deformed. This is because the hydraulic cylinders in the low pressure state of activation are preset to limit the force that can be applied thereby giving a "cushioned" or non-crushing displacement. It is to be remembered that while frame 48 is displaced up and down in a relatively fixed travel by the ball screw drive 46, the heat staking tips are held in position by the hydraulic cylinders and thus the axial pressure thereof is ultimately controlled. At this point in the method cycle, the tips of heating elements 76, 90 are in contact with the ends of the posts 20, 32 with the result that there is heat transfer from the heating elements to the posts as shown in FIG. 6. At this point in time in accordance with the the method of the invention, the third phase of the heat staking cycle begins which is shown in FIG. 9A as phase BS2 which indicates a further actuation of the stepping motor 42 to drive the ball screw 46 which moves frame 48 upwardly in a further step shown as control step C2 in FIG. 9B. This is a positive or rigid displacement. At this point, the heat staking tip elements are bearing against the posts and would, but for the presence of the hydraulic cylinders, crush the posts if the posts were not sufficiently heated to be deformed. The hydraulic cylinders, however, still act as a cushion at this point in time to allow sufficient heat buildup in the post material for proper deformation to take place. Under pressure and heat, the posts begin to deform as shown in FIG. 7, and finally FIG. 8 shows the end of the cycle with heat staking accomplished.

The curve in FIG. 9A depicts this with displacement occurring differently for the posts of zone Z1 and Z2. The curve of FIG. 9A also shows the end of the cycle wherein the heating elements 76, 90 are retracted, both the hydraulic cylinders 50, 51 and the ball screw drive 46 being reversed to a downward position and back to their initial zero displacement position. The retraction phase labeled C3 is also shown in FIG. 9B for the frame.

The method of the invention further embraces alternatively an actuation of the hydraulic cylinders which can be utilized to effect different degrees of deformation and may very well be employed to apply a firm force initially to aid in heat transfer which is then followed by a high pressure application of force once sufficient heat has been transferred. This capability is shown in FIG. 9B in terms of the curve there depicted relative to displacement in time for the second set of curves labeled HP1 and HP2, for zones Z1 and Z2 in FIG. 9A. In this regard, the dotted lines shown in FIG. 9B represent the potential for controllability of the different hydraulic cylinder cycles as well as the different frame displacement cycles which are possible. This control can optimize cycle times and thus efficiency and productivity.

In regards to the movements referred to in FIG. 9A, control of the ball screw drive 46 was effected through the stepping motor 42, in turn controlled in a standard fashion by the number of pulses supplied thereto by a conventional stepping motor power supply, in turn controlled by a program written for a personal computer and a suitable interface. With respect to the hydraulic drive and control, a high and low pressure air source was employed for a pneumatic control through a set of four solenoids, two for the zone Z1 and two for the zone Z2, one set for low pressure and one set for high pressure. High and low pressure regulators were utilized to achieve a desired degree of accuracy and tolerance with respect to desired settings and the solenoids themselves were programmed to operate in accordance with signals developed from drive circuits, in turn driven by the computer program. The solenoids were provided with air output to an air operated actuator which in turn was utilized to drive the hydraulic cylinders heretofore discussed. In this regard, the regulators, solenoids, and actuators are commercially available as are the electronic controllers utilized to control the solenoids.

Referring now to FIGS. 10–12, the heat conservation aspect of the invention will be further described. As can best be seen in FIG. 11, the base plate 56 including a projection 60 accommodates a clevis 64 locked thereto by a bolt 65. The clevis 64 is made of an insulating plastic material of polyamide having a high molecular weight and a low thermal transfer property and capable of maintaining substantial compressive loads at high temperatures. The use of the plastic material for a clevis effectively isolates the metal parts of the apparatus, the frames and lower metallic drive mechanism from thermal conduction of heat generated by the thermal elements and heating elements. As can be seen in FIG. 10, the upper portion of clevis 64 is formed into a sleeve 66 which is hollowed out to receive wires 67 attached to a heater element 70 buried within the upper end of the heat staking element contouring tip 76.

The heat staking element 76, and the additional elements 90 which are of similar construction, are typically of a metal having good heat transfer characteristics. The heater element 70 is of a type having a built-in thermocouple which can be controlled to a given temperature suitable for the particular process cycle and heat requirements called for by the particular material and process involved. The wires are suitably insulated and lead to a controllable source of current not shown, but they are of a type well known commercially as used in plastic molding.

As can be seen, the heat staking tips of the heating elements are made to have a diameter less than the diameter 101 in block 100 to provide an air gap throughout a portion of its length. Sleeves 74 made of a suitable high molecular weight plastic material comparable to that employed for block 100 are fitted around the heating elements 76, 90 to allow an axial displacement of the elements within blocks 100. As shown in FIG. 10, the interior of the element 76 has in its lower end internal threads 68 to mate with the threading on sleeve 66. As plate 56 is driven to operate upwardly and downwardly by hydraulic cylinder 50, the three tips of heating elements 76 are accordingly driven upwardly and downwardly to exit and retract relative to block 100. The heating elements 90 are similarly mounted as can be discerned from FIG. 11. Through this feature heat modification and conduction are minimized.

Referring now to FIG. 12 there is shown in detail, somewhat enlarged, a cross sectional view of the heating element 76 which can be seen to include a taper 78 with a flat surface 80 at the upper end, and at the lower end a cavity terminating in the threading 68 heretofore described. The element in FIG. 12 is shown prior to machining for use with a particular post application. FIGS. 13 and 14 show the end of the tip as revealed in FIG. 12 but machined into distinctly different shapes. The tip in FIG. 13 has been machined into the shape utilized to obtain the deformation of post 32' into the configuration shown in FIGS. 2C and 2D as 32'. The tip shown in FIG. 14 is an alternative version of such geometry which includes a center projection 79 which has been found to work better with certain materials by offering a concentration of force in a narrow point to assist in material flow, or at least initiating material flow. FIG. 15 shows heating tip 90 of the type adapted to effect the deformation as shown in FIGS. 2A and 2B relative to the post 20'. The heating tip in FIG. 15 includes a projection 91 of a somewhat reduced diameter terminating in a sharpened tip 93. In use, the tip 93 enters the indentation shown as element 25 in FIGS. 2A and 2B and then in the balance of the cycle, spreads the post there shown to the configuration which is heretofore mentioned is rivet-like.

In general, the geometries given to the tips shown in FIGS. 13 and 14 are useful with plastic materials having relatively lower flow temperatures and the tip shown in FIG. 15 is used with materials having a relatively higher temperature flow characteristic. For example, the tip of FIG. 15 may best be used with materials having substantial glass filler, making the material best suited for a flaring deformation than it would be for more of a total reflow, as is in the case with the tip configuration of FIGS. 13 and 14.

In an actual embodiment, the heating element tips were made of beryllium copper machined into the configuration shown. These tips were maintained by thermocouples of type J. Connectors such as 22 and 26 were made of a variety of materials including polyphenlyene-sulfide having both a 30 percent filler of glass material in one example and a 40 percent glass filler material in a second example. Connectors were also used made of a polypthyleneterephthanlate. A variety of other connectors made of nylon 6—6 and various other polymers were successfully heat staked utilizing the method and apparatus of the invention. In these applications, the tips for zone Z1 which were utilized in conjunction with the nylon 6—6 material were maintained at 400 degrees Fahrenheit with a low pressure setting of approximately 50 pounds and the high pressure setting of approximately 100 pounds. The tips for zone Z2 were held at a temperature of 500 degrees Fahrenheit for the connector utilizing polyphenylene-sulfide material with similar pressure settings. The lower temperature material was heat staked by the application of pressure for approximately four seconds, and the high temperature material was heat staked utilizing a time of six seconds, with the overall cycle time including the cycle phases H, BS1 and BS2 being held to eight seconds including retraction. As has been explained, these cycle times can be varied in accordance with the requirements of the plastic material and geometries of the components being heat staked. The particular duration of displacement and force application can be selectively applied as well. The positive displacement of the ball screw feed which has in essence no cushion to it, can be applied first or second or last in accordance with the requirements of the particular application, or the low pressure hydraulic cylinder force can be applied initially with the high pressure hydraulic force being applied finally. Or alternatively, any of these forces may be chosen in terms of sequence of use. In this regard, it is worth noting that the forces applied by the hydraulic cylinders can be preset so as to not exceed a certain amount such as, for example, 50, 80 or 100 pounds. What this means is that during the practice of the method with the heat tips forced against the posts of the components, should the force against such components be prematurely in excess of what it should be as for example the preset of 50 pounds when driven by the positive displacement ball screw mechanism, the hydraulic cylinders will cushion the displacement until such time as enough heat has been transferred to the plastic posts to cause them to flow into the shape defined by the heat tip. This feature alone provides a tolerance which is highly advantageous in production wherein considerable variations in the environment may be expected between start-up time, shift breaks, and the like. The ability to select which force to apply first or last and what stroke to use allows for the optimization of cycle time, considering that more than one particular component may be heat staked in the same cycle by the same apparatus with its several zones. The individual heat tips may be varied in terms of temperature, not within a given cycle but rather for a given component application so that zone Z1 may be held at, for example, 400 degrees Fahrenheit and zone Z2 at 500 degrees Fahrenheit, yielding yet a further parameter which can be varied in accordance with the method and apparatus of the invention.

In an actual embodiment of the apparatus of the invention, the insulating block was formed of a high molecular weight polymer as were the clevises employed to drive the heating elements vertically up and down out of such block, the material being commercially available from E. I. DuPont de Nemours and Company. The heater units are commercially available cartridge type heaters, the hydraulic cylinders and the ball screw drive are commercially available devices.

Having now disclosed and described the invention with reference to the preferred embodiments thereof, the scope of the invention is encompassed in the attached claims:

We claim:

1. Apparatus for joining components together by heat staking where a first component includes posts made of plastic material, which material may be subject to softening under application of sufficient heat, and a second component which includes holes through which said posts are inserted and heat staked to form an assembly of the first component to the second component, comprising:
   a. means for fixturing said first and second components against relative movement vertically or horizontally;
   b. a set of heat staking elements and means for heating said elements independently to a predetermined temperature;
   c. first means for displacing said heating elements toward and away from said posts in a positive displacement;
   d. second means for displacing said heating elements toward and away from said posts in a cushioned displacement having a first preset force level, where said second means includes means to apply a second preset force level higher than that of said first level whereby to allow an application of a higher and lower cushioned displacement of said heating elements; and e. control means for activating said first and second means sequentially whereby to drive said heating elements into contact and engagement under pressure with said posts to deform same, said second means precluding deformation prior to sufficient heat transfer to soften said posts.

2. The apparatus of claim 1 wherein said heating elements are fixedly attached to said second means and said second means is fixedly attached to said first means.

3. The apparatus of claim 1 wherein there is provided a block of insulating material surrounding said heating elements to reduce heat loss therefrom with said block being fixedly attached to said first means whereby displacement of said heating elements by said second means exposes said heating elements by extension from said block during a heating cycle.

4. The apparatus of claim 1 wherein there is provided a second set of said heating elements and a third force displacement means, with said control means operable independently to vary displacement of the sets of heating elements.

5. An apparatus for heat staking components together, wherein there is a first component having posts of a plastic material of one type and a second component having posts of a plastic material of a second type, there being a third component having holes therein adapted to receive the posts of said first and second components, a combination comprising a first set of heating elements for said first component and a second set of heating elements for said second component, with each of said heating elements having means to be heated to a given predetermined temperature, first and second displacement means, one for each of said first and second components and heating elements adapted to displace said posts to effect heat staking of said posts, control means to independently control said first and second displacement means in terms of movement in engagement with said posts and away from said posts, whereby to allow heat and pressure to be applied to said first and second heating elements to accommodate different characteristics of the posts thereof in a single operating cycle.

6. An apparatus for heat staking components together including a set of heat staking elements adapted to be displaced into engagement with component posts and away therefrom over a given distance of travel and drive means for effecting such displacement, a block of insulating material surrounding in common said heat elements, said block being apertured to receive said set of heat elements and means to relatively fix movement of said block wherein said heat elements travel from within said block out of said block into engagement with said posts in order to minimize radiation heat loss from said heat elements.

7. The apparatus of claim 6 including insulating means connected to said heat elements at said drive means to insulate said heat elements from heat transfer by conduction.

* * * * *